US010566015B2

(12) United States Patent
Freitag et al.

(10) Patent No.: US 10,566,015 B2
(45) Date of Patent: Feb. 18, 2020

(54) SPIN TRANSFER TORQUE (STT) DEVICE WITH TEMPLATE LAYER FOR HEUSLER ALLOY MAGNETIC LAYERS

(71) Applicant: Western Digital Technologies, Inc., San Jose, CA (US)

(72) Inventors: James Mac Freitag, Sunnyvale, CA (US); Zheng Gao, San Jose, CA (US); Masahiko Hashimoto, San Jose, CA (US); Sangmun Oh, San Jose, CA (US); Hua Al Zeng, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/976,606

(22) Filed: May 10, 2018

(65) Prior Publication Data
US 2019/0279667 A1 Sep. 12, 2019

Related U.S. Application Data

(63) Continuation of application No. 15/375,850, filed on Dec. 12, 2016, now abandoned.

(51) Int. Cl.
*G11B 5/127* (2006.01)
*G11B 5/39* (2006.01)
(Continued)

(52) U.S. Cl.
CPC .......... *G11B 5/3909* (2013.01); *G11B 5/1278* (2013.01); *G11B 5/17* (2013.01);
(Continued)

(58) Field of Classification Search
None
See application file for complete search history.

(56) References Cited

U.S. PATENT DOCUMENTS 6,381,106 B1 * 4/2002 Pinarbasi ............... B82Y 10/00
360/324.12
7,035,062 B1 4/2006 Mao et al.
(Continued)

FOREIGN PATENT DOCUMENTS

CN 104835510 B 11/2017
JP 2010229477 A * 10/2010
(Continued)

OTHER PUBLICATIONS

Kittel; On the Theory of Ferromagnetic Resonance Absorption; Physical Review; vol. 73, No. 2; dated Jan. 15, 1948; pp. 155-161.
(Continued)

*Primary Examiner* — William J Klimowicz
(74) *Attorney, Agent, or Firm* — Patterson & Sheridan, LLP; Steven H. Versteeg

(57) ABSTRACT

A spin transfer torque (STT) device has a free ferromagnetic layer that includes a Heusler alloy layer and a template layer beneath and in contact with the Heusler alloy layer. The template layer may be a ferromagnetic alloy comprising one or more of Co, Ni and Fe and the element X, where X is selected from one or, more of Ta, B, Hf, Zr, W, Nb and Mo. A CoFe nanolayer may be formed below and in contact with the template layer. The STT device may be a spin-torque oscillator (STO), like a STO incorporated into the write head of a magnetic recording disk drive. The STT device may also be a STT in-plane or perpendicular magnetic tunnel junction (MTJ) cell for magnetic random access memory (MRAM). The template layer reduces the critical current density of the STT device.

20 Claims, 7 Drawing Sheets

(51) Int. Cl.
  *G11C 11/16* (2006.01)
  *G11B 5/17* (2006.01)
  *G11B 5/60* (2006.01)
  *G11B 5/31* (2006.01)
  *G11B 5/35* (2006.01)
  *G11B 5/00* (2006.01)

(52) U.S. Cl.
  CPC ............ *G11B 5/314* (2013.01); *G11B 5/3146* (2013.01); *G11B 5/35* (2013.01); *G11B 5/3912* (2013.01); *G11B 5/6082* (2013.01); *G11C 11/161* (2013.01); *G11B 2005/0024* (2013.01)

(56) References Cited

U.S. PATENT DOCUMENTS

| | | | |
|---|---|---|---|
| 7,982,996 | B2 | 7/2011 | Smith et al. |
| 8,039,885 | B2 | 10/2011 | Wang et al. |
| 8,064,159 | B2 | 11/2011 | Sakamoto et al. |
| 8,085,490 | B2 | 12/2011 | Franca-Neto et al. |
| 8,194,361 | B2 | 6/2012 | Kudo et al. |
| 8,259,409 | B2 | 9/2012 | Bragana et al. |
| 8,320,080 | B1 | 11/2012 | Braganca et al. |
| 8,325,442 | B2 | 12/2012 | Koui et al. |
| 8,416,539 | B2 | 4/2013 | Carey et al. |
| 8,467,148 | B2 | 6/2013 | Iwasaki et al. |
| 8,472,151 | B2 * | 6/2013 | Wang ............... B82Y 10/00 360/324.12 |
| 8,582,240 | B1 | 11/2013 | Chen et al. |
| 8,687,319 | B2 | 4/2014 | Igarashi et al. |
| 8,824,104 | B1 | 9/2014 | Koui et al. |
| 8,953,283 | B2 | 2/2015 | Shimizu et al. |
| 8,970,996 | B2 | 3/2015 | Nagasaka et al. |
| 9,042,057 | B1 | 5/2015 | Diao et al. |
| 9,064,508 | B1 | 6/2015 | Shiimoto et al. |
| 9,099,107 | B1 | 8/2015 | Igaroshi et al. |
| 9,099,124 | B1 * | 8/2015 | Freitag ............... G01R 33/093 |
| 9,208,801 | B2 | 12/2015 | Zhang et al. |
| 9,230,571 | B1 | 1/2016 | Chen et al. |
| 9,230,597 | B2 | 1/2016 | Shimoto et al. |
| 9,236,564 | B2 | 1/2016 | Carey et al. |
| 9,275,672 | B2 | 3/2016 | Shiroishi et al. |
| 9,305,574 | B1 | 4/2016 | Nagasaka et al. |
| 9,337,415 | B1 | 5/2016 | Oh et al. |
| 9,368,135 | B2 | 6/2016 | Gao |
| 9,881,637 | B1 | 1/2018 | Wilson et al. |
| 9,893,273 | B2 * | 2/2018 | Hu ..................... H01L 43/10 |
| 10,121,497 | B1 | 11/2018 | Takahashi et al. |
| 10,186,284 | B2 | 1/2019 | Narita et al. |
| 10,236,021 | B2 | 3/2019 | Narita et al. |
| 10,276,193 | B2 | 4/2019 | Narita et al. |
| 10,325,618 | B1 | 6/2019 | Wu et al. |
| 10,366,714 | B1 | 7/2019 | Olson et al. |
| 2002/0135935 | A1 * | 9/2002 | Covington ........... G11B 5/3103 360/125.41 |
| 2008/0112095 | A1 * | 5/2008 | Carey ................... B82Y 25/00 360/324.12 |
| 2008/0304176 | A1 | 12/2008 | Takagishi et al. |
| 2009/0059423 | A1 | 3/2009 | Yamada et al. |
| 2009/0257151 | A1 * | 10/2009 | Zhang ................. G01R 33/098 360/324.2 |
| 2009/0310244 | A1 | 12/2009 | Shimazawa et al. |
| 2010/0157465 | A1 * | 6/2010 | Sakamoto ............. B82Y 10/00 360/75 |
| 2011/0134561 | A1 * | 6/2011 | Smith .................. G11B 5/1278 360/59 |
| 2013/0064971 | A1 * | 3/2013 | Carey ................. G11B 5/3906 427/123 |
| 2013/0250456 | A1 | 9/2013 | Yamada et al. |
| 2014/0139952 | A1 | 5/2014 | Takeo et al. |
| 2014/0177100 | A1 | 6/2014 | Sugiyama et al. |
| 2014/0203383 | A1 * | 7/2014 | Guo ....................... H01L 43/08 257/421 |
| 2015/0124347 | A1 | 5/2015 | Shimoto et al. |
| 2016/0027455 | A1 | 1/2016 | Kudo et al. |
| 2017/0236537 | A1 | 8/2017 | Murakami et al. |
| 2018/0268848 | A1 | 9/2018 | Narita et al. |
| 2019/0088274 | A1 | 3/2019 | Narita et al. |

FOREIGN PATENT DOCUMENTS

| | | | |
|---|---|---|---|
| JP | 2013089967 A | * | 5/2013 |
| JP | 2013251042 A | | 12/2013 |
| WO | 2015126326 A1 | | 8/2015 |

OTHER PUBLICATIONS

Fukuzawa, et al. CPP-GMR films with a current-confined-path nano-oxide layer (CCP-NOL); Journal of Physics D: Applied Physcs; vol. 40, No. 5; dated Feb. 16, 2007; abstract only.

Zhu, et al.; Microwave Assisted Magnetic Recording; IEEE Transactions on Magnetics; vol. 44, No. 1; dated Jan. 2008; 125-131.

Braganca, et al.; Nanoscale Magnetic Field Detection Using a Spin Torque Oscillator; Nanotechnology; vol. 21, No. 23; dated 2010.

Chen; Spin Torque Oscillator-Based Integrated Solutions for Magnetic Field Sensing and Wireless Communication Applications; Electronics, Circuits and Systems (ICECS); 2014 21st IEEE International Conference; dated Dec. 10, 2014.

Mallory, Mike et al; "Head and Media Challenges for 3 Tb/in2 Microwave-Assisted Magnetic Recording"; IEEE Transactions on Magnetics, vol. 50, No. 7, Jul. 2014 (8 pages).

* cited by examiner

SPIN TRANSFER TORQUE (STT) DEVICE WITH TEMPLATE LAYER FOR HEUSLER ALLOY MAGNETIC LAYERS

CROSS-REFERENCE TO RELATED APPLICATIONS

This application is a continuation of co-pending U.S. patent application Ser. No. 15/375,850, filed Dec. 12, 2016, which is herein incorporated by reference.

BACKGROUND

Field of the Invention

This invention relates generally to spin transfer torque (STT) devices, and more particularly to STT devices with Heusler alloy magnetic layers.

Description of the Related Art

Spin transfer torque (STT) is an effect in which the orientation of the magnetization of a magnetic layer in a magnetic tunnel junction (MTJ) or giant magnetoresistance (GMR) spin valve can be modified using a spin-polarized current. Electrons have a property known as spin, which is a small quantity of angular momentum. An electric current is generally unpolarized (i.e., consisting of 50% spin-up and 50% spin-down electrons), while a spin-polarized current is one with more electrons of either spin. Spin-polarized current can be produced by passing a current through a thick magnetic layer (usually called the "fixed" layer or "polarizing" layer). When spin-polarized current above a critical current density is directed into a second, thinner magnetic layer (the "free" layer), angular momentum can be transferred to the free layer, changing the orientation of the free layer's magnetization. This can be used to excite oscillations of the free layer's magnetization, as in a spin-torque oscillator (STO) type of STT device, or flip the orientation of the free layer's magnetization, as in STT memory cells in a non-volatile magnetic random access memory (MRAM) storage device.

The spin-torque oscillator (STO) type of STT device as been proposed for sensing magnetic fields, as described by P. M. Braganca, et al., "Nanoscale magnetic field detection using a spin torque oscillator," *Nanotechnology*, vol. 21, no. 23, p. 235202, 2010, and in U.S. Pat. No. 8,259,409 B2 assigned to the same assignee as this application. The STO has also been proposed for wireless communications applications, as described by T. Chen, "Spin Torque Oscillator-based Integrated Solutions for Magnetic Field Sensing and Wireless Communication Applications", *Electronics, Circuits and Systems (ICECS)*, 2014 21st IEEE International Conference on (pp. W005-), IEEE conference proceedings.

A STO type of STT device has also been proposed for perpendicular magnetic recording (PMR) systems, like a PMR disk drive, by incorporation of the STO into the disk drive's conventional write head. In one type of system using a STO, called microwave-assisted magnetic recording (MAMR), a high frequency oscillatory auxiliary magnetic field from the ferromagnetic free layer (also called the field generation layer (FGL) in a STO) is applied to the magnetic grains of the recording layer. The auxiliary field may have a frequency close to the resonance frequency of the magnetic grains in the recording layer to facilitate the switching of the magnetization of the grains at lower write fields from the conventional write head than would otherwise be possible without assisted recording. Conversely, MAMR may be used to increase the coercivity of the magnetic recording layer above that which could be written to by a conventional PMR alone. The increase in coercivity afforded by MAMR allows for a reduction in the size of the magnetic grains and thus a corresponding increase in recording density. MAMR systems are described by J. G. Zhu et al., "Microwave Assisted Magnetic Recording", *IEEE Transactions on Magnetics*, Vol. 44, No. 1. January 2008, pp. 125-131; and in U.S. Pat. No. 7,982,996 B2 and U.S. Pat. No. 8,970,996 B2, both assigned to the same assignee as this application. In a PMR system with a STO incorporated into the disk drive's, conventional write head, even if the oscillatory auxiliary magnetic field from the free layer does not provide microwave assistance to writing, the free layer can have a DC field component that will assist writing by the conventional write head.

SUMMARY

In both the STO type of STT device and in a STT-MRAM cell, one or both of the magnetic layers may be formed of Heusler alloys, which are known to have high spin polarization. Heusler alloy layers are difficult to fabricate and require high-temperature annealing to obtain the required crystalline structure. It is also important in STT devices to reduce the critical current, particularly in a disk drive write head where high temperatures can reduce the long-term reliability of the write head. Thus what is needed is a STT device with Heusler alloy magnetic layers that can operate with reduced critical current.

Some embodiments of the invention relate to a spin transfer torque (STT) device wherein the ferromagnetic free layer includes a Heusler alloy layer and a template layer located beneath and in contact with the Heusler alloy layer. The template layer may be a ferromagnetic alloy comprising one or more of Co, Ni and Fe and the element X, where X is selected from one or more of Ta, B, Hf, Zr, W, Nb and Mo. In one embodiment, the template layer may be a ferromagnetic CoFeBTa alloy. A CoFe nanolayer may be formed on the substrate below and in contact with the template layer. The template layer reduces the critical current density of the STT device. The ferromagnetic polarizing layer may also comprise a Heusler alloy layer and a template layer. The STT device may be a spin-torque oscillator (STO), like a STO incorporated into the write head of a magnetic recording disk drive. The STT device may also be a STT magnetic random access memory (MRAM) cell, like an in-plane or perpendicular magnetic tunnel junction (MTJ) for use in a MRAM storage device.

For a fuller understanding of the nature and advantages of the present invention, reference should be made to the following detailed description taken together with the accompanying figures.

DETAILED DESCRIPTION

Figure 1:
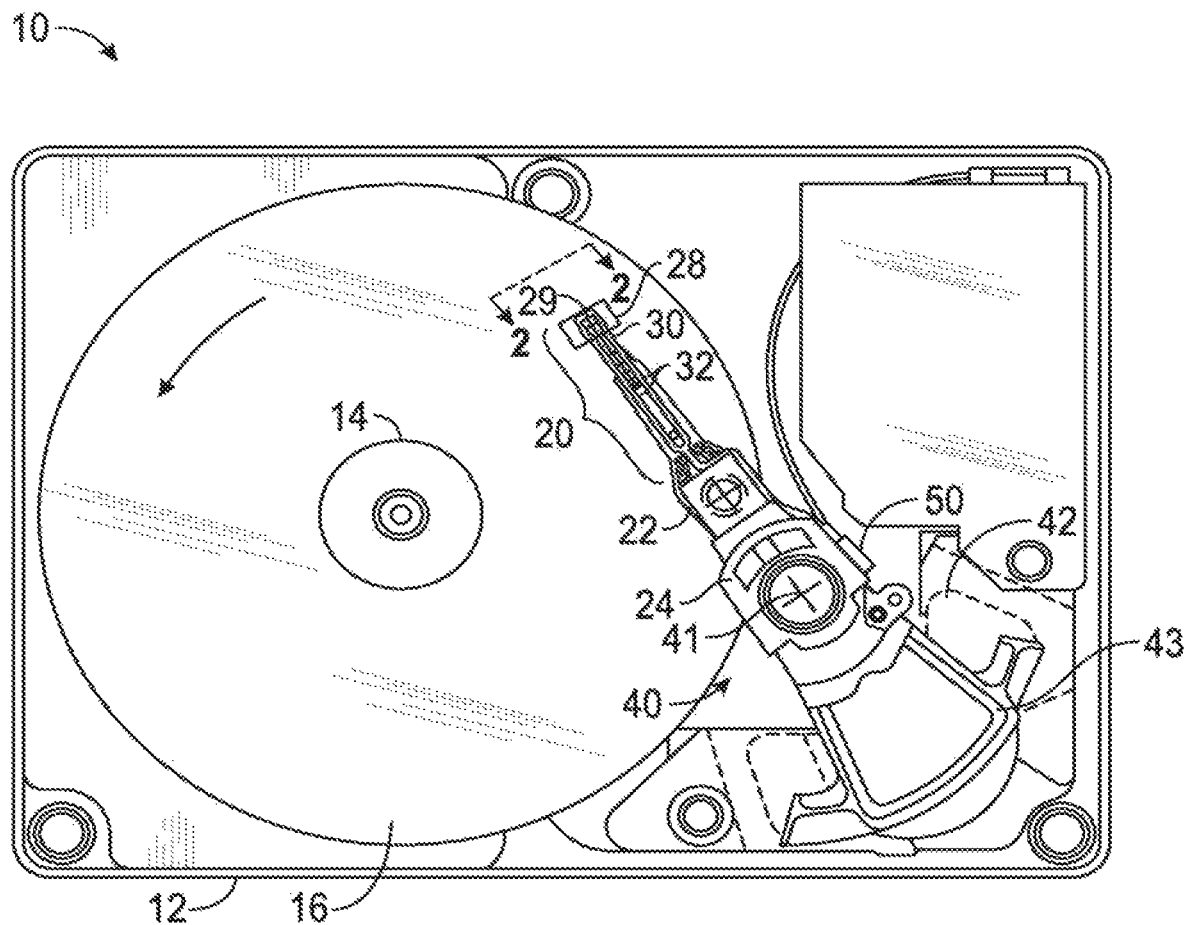
FIG. 1 is a top plan view of a conventional head/disk assembly of a hard disk drive with the cover removed.

FIG. 1 a top plan view of a conventional head/disk assembly of a hard disk drive 10 with the cover removed. The disk drive 10 includes a rigid base 12 supporting a spindle 14 that supports a stack of disks, including top disk 16. The spindle 14 is rotated by a spindle motor (not shown) for rotating the disks in the direction shown by curved arrow on disk 16. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E-block 24. Each flexure 30 is attached to an air-bearing slider 28. A magnetic recording read/write head 29 is located at the end or trailing surface 25 of slider 28. In embodiments of this invention the write head 29 will incorporate a spin-torque oscillator (STO) type of STT device (not shown). The flexure 30 enables the slider 28 to "pitch" and "roll" on an air-bearing generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit.

Figure 2A:
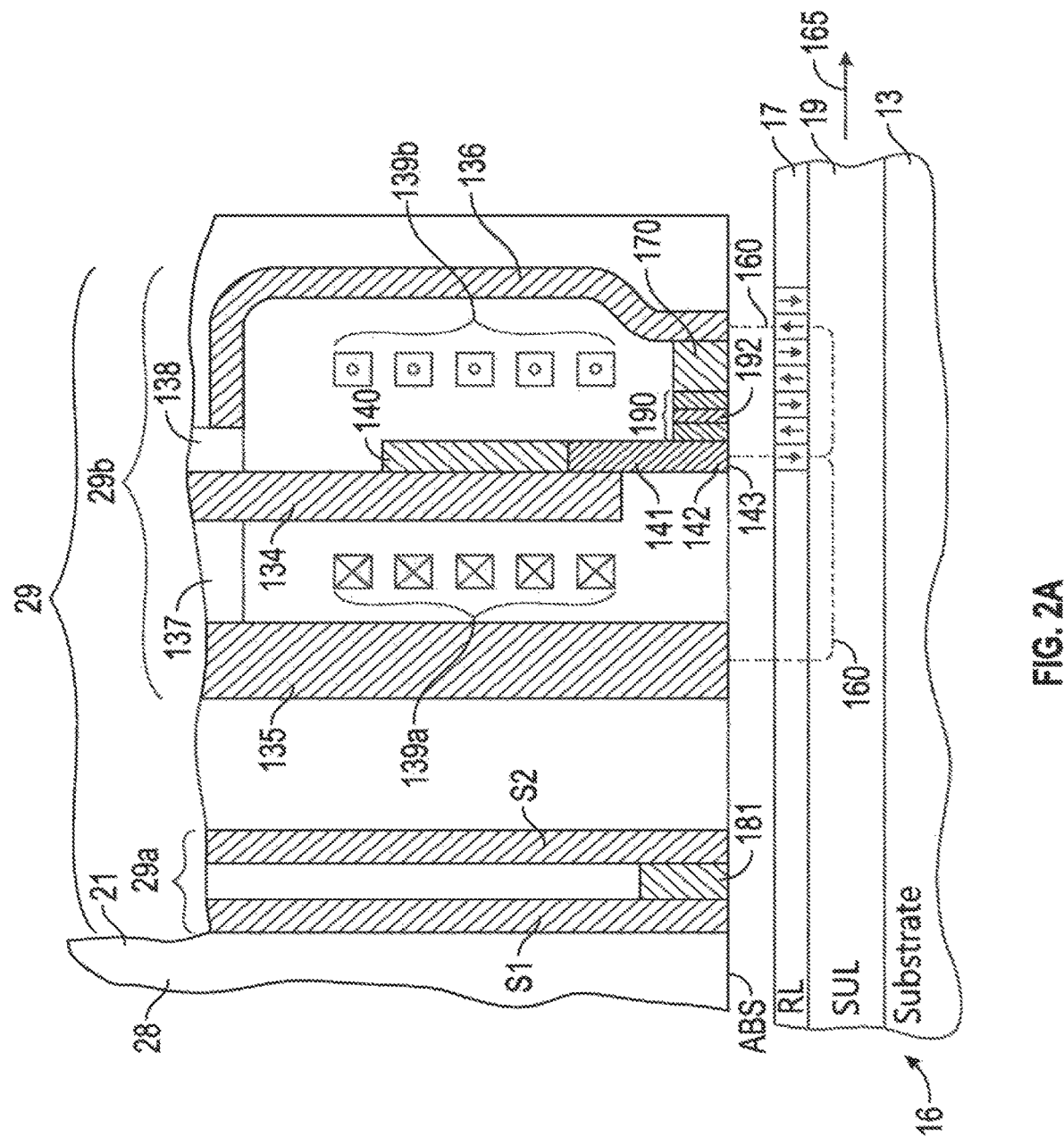
FIG 2A is a side sectional view of a perpendicular magnetic recording (PMR) write head with an incorporated spin-torque oscillator (STO) as proposed in the prior art, a read head and a recording disk taken through a central plane that intersects the disk.

FIG. 2A is a side sectional view of a perpendicular magnetic recording write head with an incorporated STO as proposed in the prior art, a read head and a recording disk taken through a central plane that intersects a data track on the disk. As shown in FIG. 2A, a "dual-layer" disk 16 includes a perpendicular magnetic data recording layer (RL) 17 on a "soft" or relatively low-coercivity magnetically permeable underlayer (SUL) 19 formed on the disk substrate 13. The read/write head 29 is formed on slider 28 and includes read head 29a and write head 29b. Read head 29a includes a magnetoresistive (MR) read element or sensor 181 located between two magnetic shields S1, S2. The write head 29b is a single write pole type of perpendicular magnetic recording (PMR) write head and includes a yoke structure with main pole 134, write pole 140, first flux return pole 135, second flux return pole 136, trailing magnetic shield 170, STO 190 between write pole 140 and trailing shield 170, and yoke studs 137, 138 connecting the main pole and return poles 135, 136 respectively. The write head 29b also includes a thin film coil 139a, 139b shown in section around main pole 134. The write coil 139a, 139b is a helical coil wrapped around main pole 134, but the write coil may also be a conventional dual "pancake" coil in which all the coil sections are in substantially the same plane and wrapped around the yoke. A flared write pole (WP) 140 is part of the main pole 134 and has a flared portion 141 and a pole tip 142 with an end 143 that faces the outer surface of disk 16. Write current through coil 139a, 139b induces a magnetic field (shown by dashed line 160) from the WP 140 that passes through the RL 17 (to magnetize the region of the RL 17 beneath the WP 140), through the flux return path provided by the SUL 19, and back to the ends 35a, 36a of return poles 35, 36, respectively.

The read/write head 29 is typically formed as a series of thin films deposited on a trailing surface 21 of air-bearing slider 28 that has its air-bearing surface (ABS) supported above the surface of disk 16. The MR read head 29a is comprised of MR sensor 181 located between MR shields S1 and S2 and is deposited on the trailing end 21 of the slider 28 prior to the deposition of the layers making up the write head 29b. In FIG. 2A, the disk 16 moves past the write head 29b in the direction indicated by arrow 165, so the portion of slider 28 that supports the read head 29a and write head 29b is often called the slider "trailing" end, and the surface 21 perpendicular to the slider ABS on which the write head 29b is located is often called the slider "trailing" surface.

The RL 17 illustrated with perpendicularly recorded or magnetized regions, with adjacent regions having opposite magnetization directions, as represented by the arrows. The magnetic transitions between adjacent oppositely-directed magnetized regions, are detectable by the MR sensor 181 as the recorded bits.

FIG. 2A also illustrates a trailing shield (TS) 170 spaced from WP 140. The TS 170 is formed of ferromagnetic material. The STO 190 is located between WP 140 and TS 170. The STO 190 includes a ferromagnetic free layer 192 whose magnetization precesses in the presence of DC current from electrical circuitry (not shown) connected to the WP 140 and the TS 170.

Figure 2B:
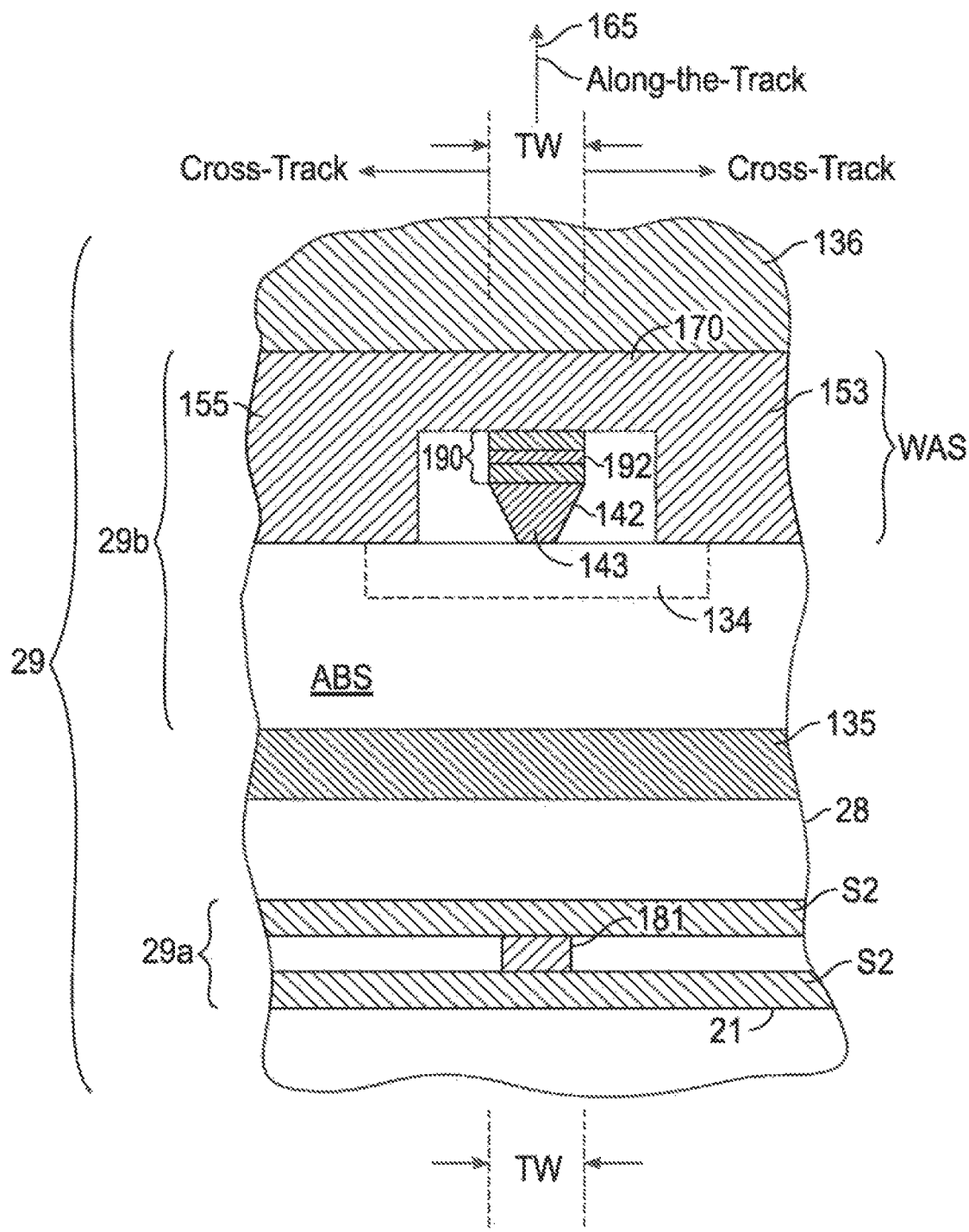
FIG. 2B is a view of the read/write head of FIG. 2A as seen from the disk.

FIG. 2B illustrates the read/write head 29 as seen from the disk 16. The ABS is the recording-layer-facing surface of the slider 28 that faces the disk 16 (FIG. 2A) and is shown without the thin protective overcoat typically present in an actual slider. The recording-layer-facing surface shall mean the surface of the slider 28 that is covered with a thin protective overcoat, the actual outer surface of the slider if there is no overcoat, or the outer surface of the overcoat. The phrase "substantially at the recording-layer-facing surface" shall mean actually at the surface or slightly recessed from the surface. The disk 16 (FIG. 2A) moves relative to the read/write head 29 in the direction 165, which is called the along-the-track direction. The direction perpendicular to direction 165 and parallel to the plane of the ABS is called the cross-track direction. The width of the end 143 of WP tip 142 in the cross-track direction substantially defines the track-width (TW) of the data tracks in the RL 17 (FIG. 2A). The main pole 134 is shown with dashed lines because it is recessed from the ABS (see FIG. 2A).

The portions identified as 153, 155 on opposite ends of TS 170 are side shields which, together with TS 170, form a wraparound shield (WAS) that generally surrounds the WP tip 142. The WAS that includes side shields 153, 155 and TS 170 is described in detail as a shield for a conventional perpendicular recording head in U.S. Pat. No. 7,002,775 B2, assigned to the same assignee as this application. The shields 170, 153, 155 all have ends substantially at the recording-layer-facing surface. The shields 170, 153, 155 are formed as a single-piece structure to form the WAS that substantially surrounds the WP tip 142 and are thus formed of the same material, typically a NiFe, CoFe or NiFeCe alloy, so that they have the same alloy composition. The side shields 153, 155 are separated from WP tip 142 by nonmagnetic gap material. The STO 190 with free layer 192 is located between the WP tip 142 and the TS 170. The WAS alters the angle of the write field and improves the write field gradient at the point of writing, and also shields the writing field at regions of the RL away from the track being written. The WAS is shown as connected to the return pole 136. However, the WAS may be a "floating" WAS shield not connected to either the return pole 136 or other portions of the yoke by flux-conducting material. Also, instead of a WAS, the write head 29b may have separate side shields not connected to the TS 170.

Figure 3:
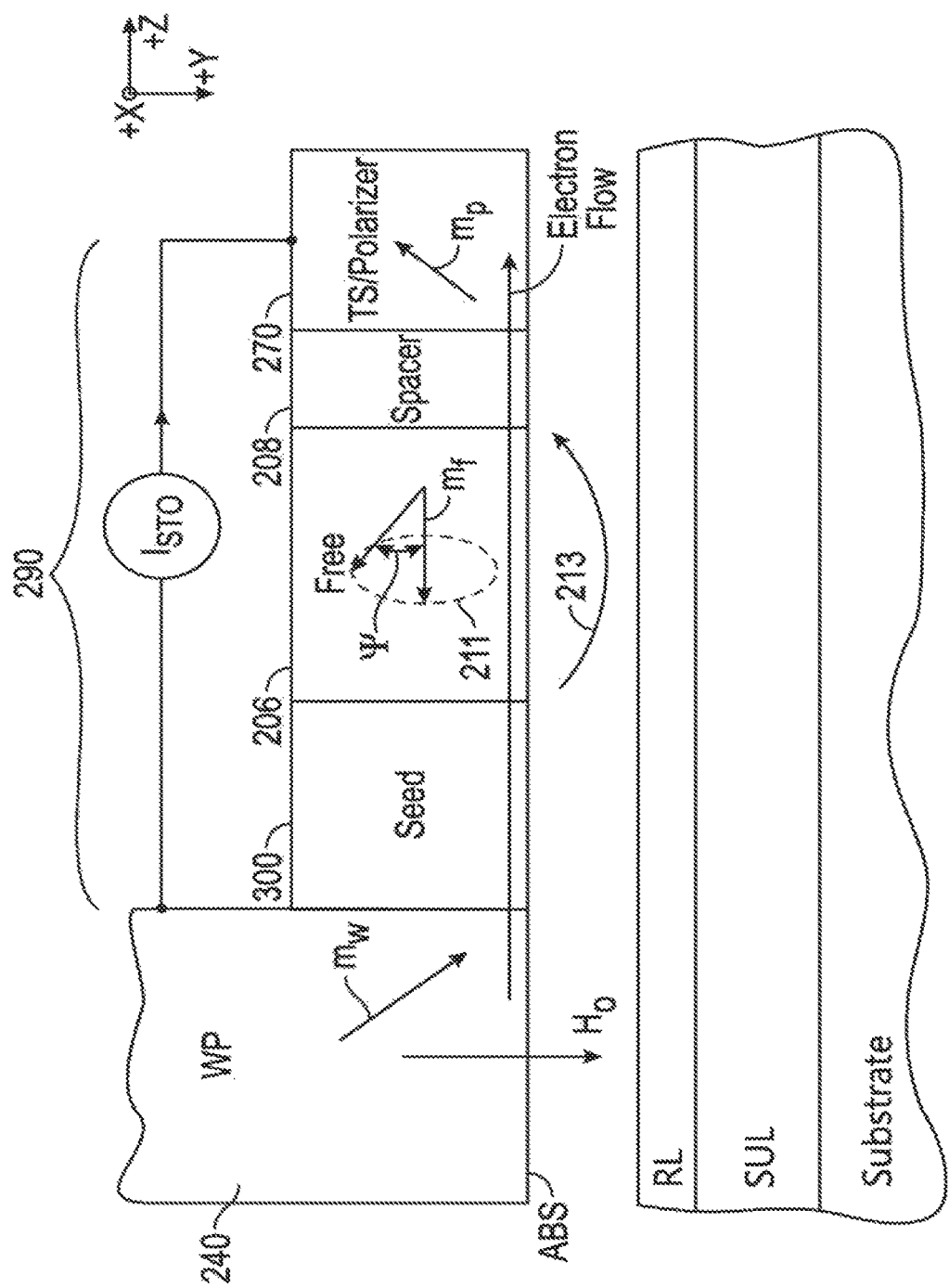
FIG. 3 is a side sectional view of a PMR write head with a STO incorporated into the write head according to an embodiment of the invention.

FIG. 3 is a side sectional view of a PMR write head with a spin-torque oscillator (STO) 290 incorporated into the write head according to an embodiment of the invention. During writing, the STO electrical circuitry provides DC current $I_{STO}$ between the WP 240 and the TS 270. The WP 240 has a magnetization ($m_w$) and thus generates spin-polarized electrons when write current is applied to the write coil. The electron flow, by convention, is in the opposite direction from the WP 240 to the TS 270. The TS 270, which is formed of ferromagnetic material like CoFe, acts as the polarizer, i.e., the supplier of spin-polarized electrons, for the STO 290 and has a magnetization ($m_p$). The STO's ferromagnetic free layer 206 has an edge substantially at the ABS and has its magnetization ($m_r$) free to rotate. A nonmagnetic spacer layer 208 is located between the free layer 206 and the polarizer/TS 270. The nonmagnetic spacer layer 208 is typically formed of Cu, but may also be formed of other materials like Au or Ag. A nonmagnetic electrically-conducting multilayered seed layer 300 is located between the WP 240 and the free layer 206. The stack of layers making up the STO 290 are formed on the slider body after the write pole 240 is formed, using conventional deposition and lithographic techniques well-known in the fabrication of thin film read/write heads.

In operation of the STO 290, DC current ($I_{STO}$), with a current density J above a critical value $J_C$, is applied across the WP 240 and the TS 270. The flow of electrons is from the WP 240 through the seed layer 300 and free layer 206 to polarizer/TS 270, where the electrons are reflected and become spin-polarized. The reflected spin-polarized electrons apply a spin torque on the magnetization $m_f$ of the free layer 206. This induces a precessional motion of magnetization $m_f$ of the free layer 206. The polarizer magnetization $m_p$ is oriented slightly up and away from the RL in the presence of the write field $H_0$ from the WP 240. The free layer magnetization $m_f$ makes an angle Ψ with the X-Y plane and has a component in the X-Y plane that rotates at an azimuthal angle about the Z-axis with a certain frequency f. The rotation of the free layer magnetization about the Z-axis at this approximately fixed angle Ψ is depicted by the oval 211 which represents a circular precessional motion of the tip of the magnetization vector $m_f$ lying in a plane parallel to the X-Y plane. The frequency of precession depends on the properties and thicknesses of the materials making up the STO 290, but for a specific STO the frequency of precession is a function of the values of both $I_{STO}$ and $H_0$.

During writing, the WP 240 applies a write field $H_0$ to the magnetic grains in the recording layer (RL) at the same time the precession of the free layer magnetization $m_f$ from the STO 290 applies an auxiliary ac field at frequency f to the magnetic grains. This results in microwave-assisted magnetic recording (MAMR), which improves the switching of the magnetization of the grains in the RL, with the improvement depending on the frequency f at which the auxiliary field is applied. As is well known in the art, ferromagnetic materials absorb energy from AC magnetic fields more efficiently at or near their ferromagnetic resonance frequency, as described in Kittel C., "On the Theory of Ferromagnetic Resonance Absorption", *Phys. Rev.* 73, pp. 155-161 (1948). Accordingly, the frequency f of the auxiliary magnetic field from the free layer 206 of the STO 290 is designed to be preferably within a range near the ferromagnetic resonance of the magnetic material making up the grains in the RL, e.g., about 30-50 GHz. As a result, the write field required from the conventional PMR write head can be reduced from what would be required to switch the magnetization of the grains in the RL without MAMR. Conversely, MAMR may be used to increase the coercivity of the RL above that which could be written to by a conventional PMR write head alone. However, even if the frequency f of the auxiliary magnetic field from the free layer 206 is not near the resonance of the magnetic material in the grains of the RL, so that there is no microwave assistance, the magnetization $m_f$ will still provide a DC field component, as shown by arrow 213, that will assist the write field $H_0$. When write current from the coil is switched, the write field is switched from the direction into the RL (as depicted in FIG. 3) to out of the RL, which results in a switching of directions of the magnetizations $m_w$, $m_p$ and $m_f$, as well as the direction of DC field component 213.

Figure 4A:
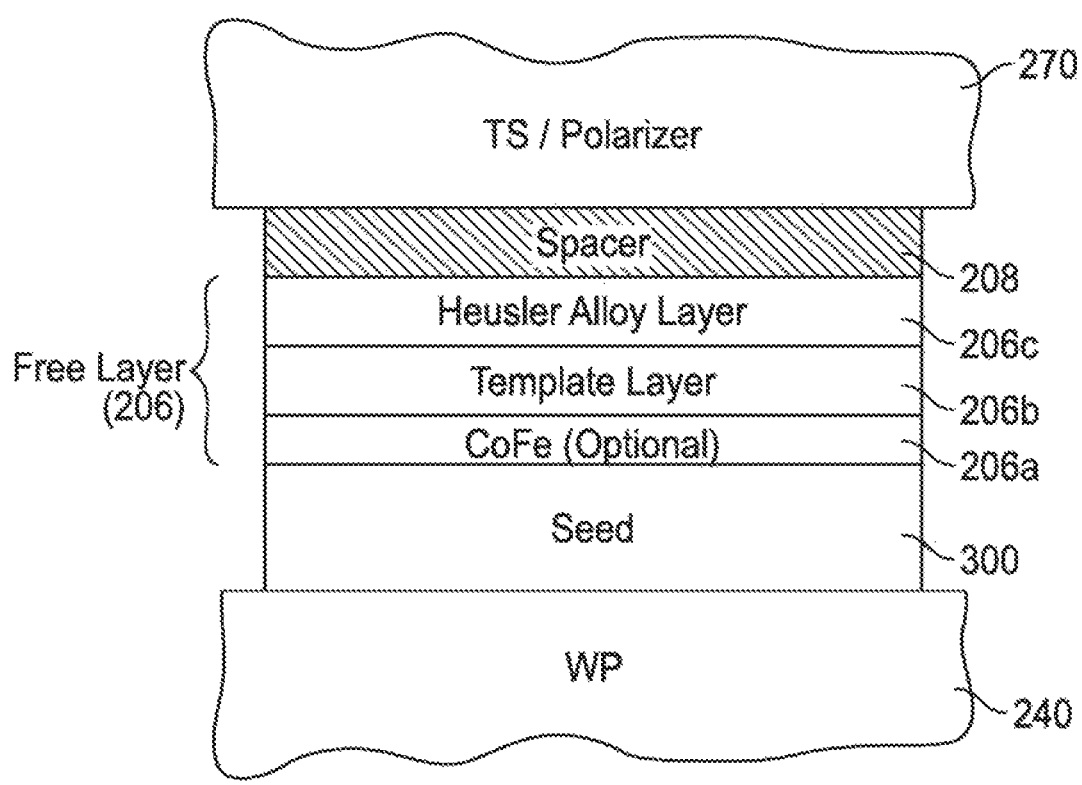
FIG. 4A is a side sectional view of the write head with incorporated STO according to another embodiment of the invention.

In an embodiment of this invention, as shown in the sectional view of FIG. 4A, the free layer 206 is a multilayer comprising an optional CoFe nanolayer 206a, a ferromagnetic template layer 206b and a Heusler alloy layer 206c. Any one of the layers 206a, 206b and 206c may have a thickness between about 0.1 to 3.0 nm, with the total thickness of multilayer free layer 206 being between about 3 to 9 nm. The seed layer 300 may be a multilayer of nonmagnetic metals or nonmagnetic alloys, like one or more of Cu, Cr, Ta, Ru, Hf, Nb and NiAl. In one embodiment the seed layer is formed of a Cu/Ta/Ru multilayer with a total thickness of about 6 nm.

Figure 4B:
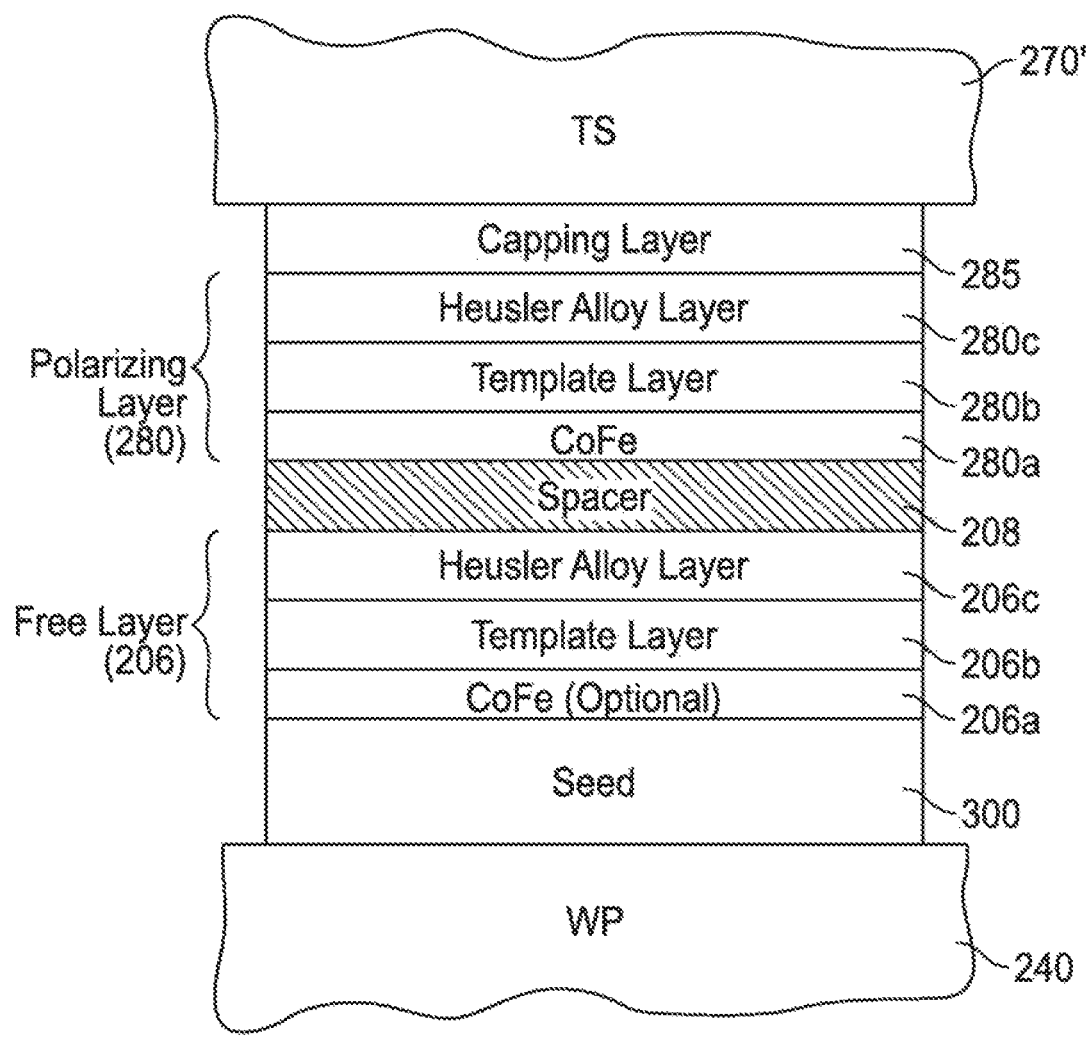
FIG. 4B is a side sectional view of the write head with incorporated STO according to another embodiment of the invention.

FIG. 4B is a side sectional view of the write head with incorporated STO according to another embodiment of the invention. In this embodiment the seed layer 300 and free layer 206 are like those in FIG. 4A, but there is a separate polarizer layer 280 adjacent the spacer layer 208 and a magnetic or nonmagnetic capping layer 285 between the polarizer layer 280 and the TS 270'. The polarizer layer 280 is also a multilayer, like multilayer free layer 206 in FIG. 4A, comprising a CoFe nanolayer 280a, a template layer 280b and a Heusler alloy layer 280c. The capping layer 285 may be formed of a layer or multilayer of metals or metal alloys like FeCo,Ta, NiCr and Ru.

Examples of Heusler alloys include but are limited to the full Heusler alloys $Co_2MnX$ (where X is one or more of Al, Sb, Si, Sn, Ga, or Ge) and $Co_2FeZ$ (where Z is one or more of Ge, Si, Al, Sn or Ga). Examples also include but are not limited to the half Heusler alloys NiMnSb, and PtMnSb. A perfect Heusler alloy will have 100% spin-polarization. However it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the L21 Heusler structure. Nevertheless, the spin polarization may exceed that of conventional ferromagnetic alloys. Thus, as used herein a "Heusler alloy"

shall mean an alloy with a composition substantially the same as that of a known Heusler alloy, and which results in enhanced spin polarization compared to conventional ferromagnetic materials such as NiFe and CoFe alloys.

The template layers 206b and 208b are formed of a ferromagnetic alloy comprising one or more of Co, Ni and Fe and the element X, where X is selected from one or more of Ta, B, Hf, Zr, W, Nb and Mo. In one embodiment the template layers may be a ferromagnetic CoFeBTa alloy.

A STO similar to that shown in FIG. 4A with a 0.1-1.0 nm CoFe nanolayer on a seed layer, a 0.3-1.2 nm thick magnetic CoFeBTa template layer on the CoFe nanolayer and with a 2-8 nm thick $Co_2MnGe$ Heusler alloy layer on and in contact with the template layer was measured for magnetoresistance ($\Delta R/R$) and critical current density ($J_C$). The structure showed a 100% increase in $\Delta R/R$ and a 30% reduction in $J_C$ over an identical structure but without the CoFeBTa template layer when formed at a low annealing temperature of about 200° C. The reduction in $J_C$ means a reduction in heating of the STO and the material surrounding it, and thus better reliability for the write head. Also, even if the driving current $I_{STO}$ is not reduced, but maintained, the STO will have better performance. The template layer 206b the free layer 206 (FIGS. 4A and 4B) is thus important to reduce the critical current density. However, the template layer 280b in the polarizing layer 280 (FIG. 4B) can be considered optional because, while it improves the crystalline structure of the Heusler alloy layer 280c, it has not been shown to substantially reduce the current density.

While the embodiment of FIG. 4B shows the free layer as the lower layer, i.e., located between a substrate (WP 240) and spacer layer 208, the STO may have the polarizing layer 280 located between the substrate and the spacer layer 208.

Figure 5:
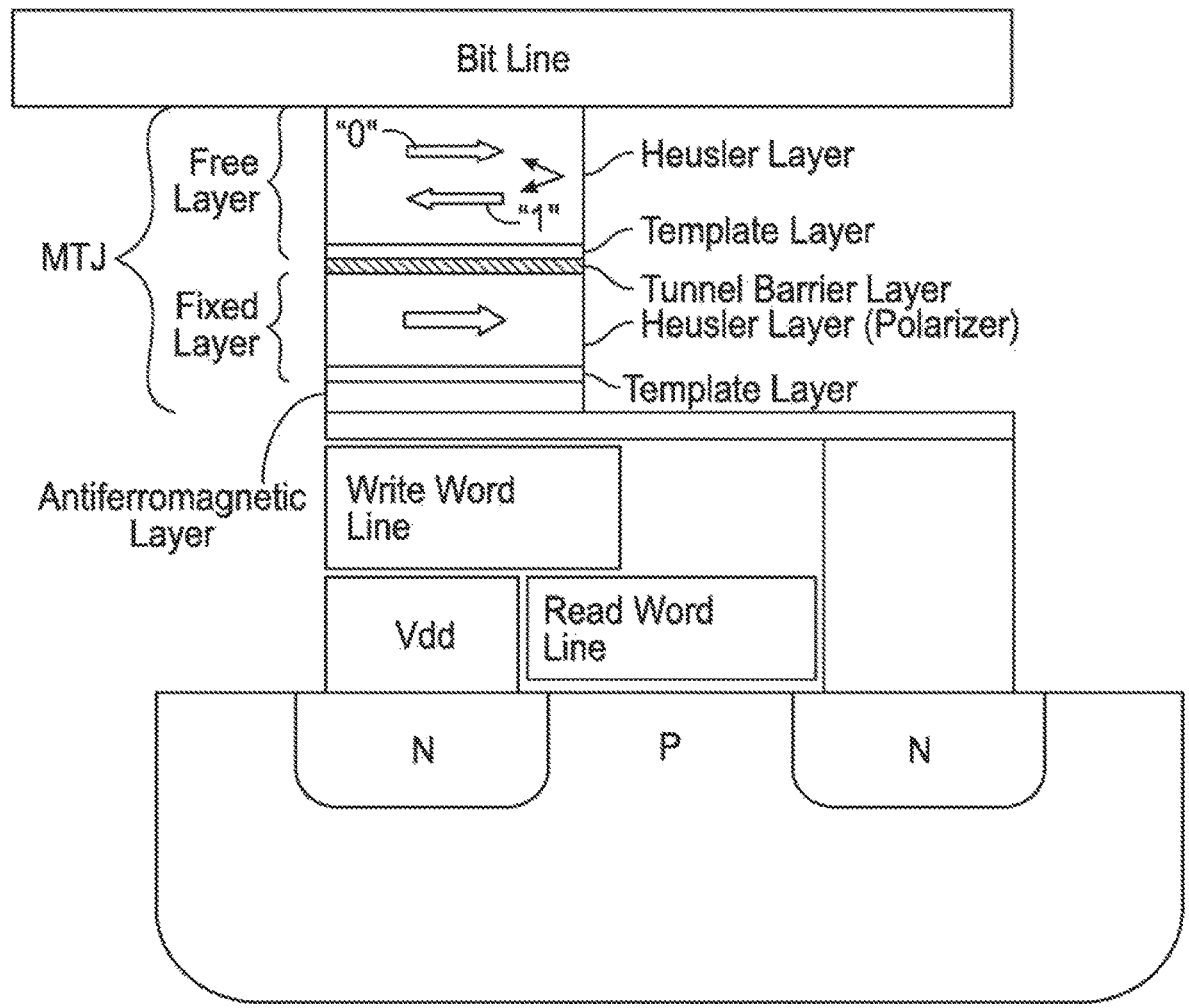
FIG. 5 is a view of a spin transfer torque magnetic random access memory (STT-MRAM) in-plane magnetic tunnel junction (MTJ) cell according to an embodiment of the invention.

A STT-MRAM in-plane magnetic tunnel junction (MTJ) cell according to an embodiment of the invention is depicted in FIG. 5. In a MRAM structure the STT device is a MTJ cell that includes a ferromagnetic pinned or fixed layer, a dielectric tunnel barrier layer (like a $Mg_O$ tunnel barrier layer) and a ferromagnetic free layer. The fixed layer acts as the polarizing layer for the source of spin-polarized electrons. The orientation of the magnetization of the fixed layer is fixed in the presence of STT current, while the orientation of the magnetization of the free layer is capable of switching from a parallel configuration with respect to that of the fixed layer (low resistance state by "0") to an antiparallel configuration (high resistance state or "1") by applying STT current through the MTJ cell. Thus, two binary states can be realized for digital data storage in the MRAM. In an embodiment according to the invention, each of the fixed and free layers comprises a Heusler alloy as described above and is formed on and in contact with a template layer as described above. While FIG. 5 depicts an in-plane MTJ cell, the STT-MRAM may also be one with MTJ cells wherein each of the fixed and free layers has its magnetization oriented perpendicular-to-the-plane. In a perpendicular MTJ cell, the Heusler alloy fixed layer may be coupled to a ferromagnetic multilayer with perpendicular magnetic anisotropy, like a Co/Pt or Co/Pd multilayer, and the Heusler alloy free layer may be coupled to a Co/Ni ferromagnetic multilayer to achieve perpendicular magnetization.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A spin transfer torque (STT) device comprising:
   a substrate; and
   a stack of layers formed on the substrate and comprising:
      a free layer comprising a first ferromagnetic Heusler alloy layer, a first template layer located beneath and in contact with the first Heusler alloy layer, and a first CoFe layer located beneath and in contact with the first template layer,
      a ferromagnetic polarizing layer comprising a second Heusler alloy layer, a second template layer located beneath and in contact with the second Heusler alloy layer, and a second CoFe layer located beneath and in contact with the second template layer, and
      a nonmagnetic spacer layer between the first Heusler alloy layer of the free layer and the second CoFe layer of the polarizing layer,
      wherein the first template layer comprises an alloy comprising one or more of Co, Ni and Fe and the element X, where X is selected from one or more of Ta, B, Hf, Zr, W, Nb and Mo.

2. The device of claim 1 wherein the free layer is located between the substrate and the spacer layer.

3. The device of claim 1 wherein the first template layer comprises a CoFeBTa alloy.

4. The device of claim 1 wherein the first template layer has a thickness greater than or equal to 0.1 nm and less than or equal to 3 nm.

5. The device of claim 1 wherein the second Heusler alloy layer is selected from the group consisting of Co2MnX (where X is selected from the group consisting of Al, Sb, Si, Sn, Ga, and Ge), Co2FeZ (where Z is selected from one or more of Ge, Si, Al, Sn or Ga), NiMnSb and PtMnSb.

6. The device of claim 5 wherein the second template layer comprises one or more of Co, Ni and Fe and the element X, where X is selected from one or more of Ta, B, Hf, Zr, W, Nb and Mo.

7. A magnetic recording write head comprising the device of claim 1 wherein the substrate is a magnetic write pole of the magnetic recording write head for magnetizing regions in a magnetic recording layer, wherein said stack of layers further comprises a nonmagnetic electrically-conducting seed layer on the write pole, and wherein the first CoFe layer is located on the seed layer.

8. The write head of claim 7 wherein the first CoFe layer is disposed between the seed layer and the first template layer.

9. The write head of claim 7 wherein the write head includes a trailing shield, wherein said stack of layers is located between the write pole and the trailing shield and further comprises a capping layer between the polarizing layer and the trailing shield.

10. The write head of claim 7 further comprising electrical circuitry coupled to the device and wherein the free layer is adapted to provide microwave-assisted magnetic recording to the recording layer in the presence of current through said electrical circuitry.

11. A disk drive comprising the magnetic recording write head of claim 7.

12. An STT magnetic random access memory (MRAM) cell comprising the STT device of claim 1, wherein the polarizing layer has a substantially fixed magnetization direction and wherein the spacer layer comprises a magnetic tunnel junction (MTJ) tunnel barrier layer.

13. The MRAM cell of claim 12 wherein the magnetization directions of each of the free and polarizing layers is substantially perpendicular to the planes of the free and polarizing layers.

14. A MRAM storage device comprising:
a plurality of MRAM cells, each according to claim 12.

15. A magnetic recording disk drive perpendicular recording write head for magnetizing regions of a perpendicular magnetic recording layer on a disk, the head being formed on a slider having an air bearing surface (ABS) and comprising:
- a substrate;
- a write pole on the substrate and having an end substantially at the ABS;
- an electrically conductive coil coupled to the write pole, the write pole capable of generating a magnetic write field in the presence of electrical write current through the coil;
- a spin-torque oscillator (STO) on the write pole and comprising (a) a ferromagnetic free layer having an edge at the ABS, (b) a ferromagnetic polarizing layer, and (c) a nonmagnetic spacer layer between the free layer and the polarizing layer, wherein:
    - the free layer is formed of a first ferromagnetic Heusler alloy layer, a first template layer located beneath and in contact with the first Heusler alloy layer, and a first CoFe layer located beneath and in contact with the first template layer,
    - the first template layer comprises an alloy comprising one or more of Co, Ni and Fe and the element X, where X is selected from one or more of Ta, B, Hf, Zr, W, Nb and Mo, and
    - the ferromagnetic polarizing layer is formed of a second Heusler alloy layer, a second template layer located beneath and in contact with the second Heusler alloy layer, and a second CoFe layer located beneath and in contact with the second template layer; and
- electrical circuitry coupled to the STO and capable of supplying direct current between the free layer and the polarizing layer when write current is supplied to the coil.

16. The head of claim 15 wherein the free layer is located between the write pole and the spacer layer.

17. The head of claim 15 further comprising a nonmagnetic electrically-conducting seed layer between the write pole and the first template layer.

18. The head of claim 17 wherein the first CoFe layer is disposed between the seed layer and the first template layer.

19. The head of claim 15 wherein the free layer is adapted to provide microwave-assisted magnetic recording to the recording layer in the presence of current through said STO electrical circuitry.

20. A magnetic recording disk drive comprising:
the write head of claim 15; and
a magnetic recording disk having a perpendicular magnetic recording layer.

* * * * *